United States Patent
Tian et al.

(10) Patent No.: US 8,648,887 B2
(45) Date of Patent: Feb. 11, 2014

(54) METHOD FOR QUICKLY ADJUSTING THE WAVEFORM BRIGHTNESS OF DIGITAL THREE-DIMENSIONAL OSCILLOSCOPE

(75) Inventors: Shulin Tian, Chengdu (CN); Peng Ye, Chengdu (CN); Lianping Guo, Chengdu (CN); Jun Jiang, Chengdu (CN); Duyu Qiu, Chengdu (CN); Qinchuan Zhang, Chengdu (CN); Hao Zeng, Chengdu (CN); Chuanyun Xiang, Chengdu (CN); Kuojun Yang, Chengdu (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 204 days.

(21) Appl. No.: 13/245,215

(22) Filed: Sep. 26, 2011

(65) Prior Publication Data

US 2012/0154452 A1 Jun. 21, 2012

(30) Foreign Application Priority Data

Dec. 17, 2010 (CN) .......................... 2010 1 0593528

(51) Int. Cl.
*G09G 5/10* (2006.01)
(52) U.S. Cl.
USPC ............................... 345/690; 345/89; 345/204
(58) Field of Classification Search
USPC ............................... 345/690, 87–94, 204–215
See application file for complete search history.

(56) References Cited

U.S. PATENT DOCUMENTS

| 5,929,842 | A | * | 7/1999 | Vertregt et al. | 345/690 |
| 6,057,853 | A | * | 5/2000 | Siegel et al. | 345/600 |
| 6,222,521 | B1 | | 4/2001 | Ivers et al. | |
| 6,249,115 | B1 | | 6/2001 | Yost et al. | |
| 2007/0052735 | A1 | * | 3/2007 | Chou | 345/690 |

* cited by examiner

*Primary Examiner* — Dwayne Bost
*Assistant Examiner* — Ivelisse Martinez Quiles
(74) *Attorney, Agent, or Firm* — Vedder Price P.C.; Thomas J. Kowalski; Rebecca G. Rudich

(57) ABSTRACT

A method for adjusting the waveform brightness for a waveform formatted to be displayed on a digital three-dimensional (3D) oscilloscope having M brightness gradation levels to display the waveform on a digital 3D oscilloscope having L brightness gradation levels is includes, creating a ROM in an FPGA and storing a look-up table of screen display brightness value of LCD that is corresponding to the waveform occurrence N(T,A) at the current brightness gradation L. The ROM is divided into $2^a$ sub ROMs, each sub ROM has the capacity of $2^b \times d$ bits. A value of round($p_L \cdot$N(T,A)) is assigned to waveform brightness value D(T,A) and is stored correspondingly into the subROM$_L$ of $2^b \times d$ bits by ascending order of the b bits of binary data of waveform occurrence N(T,A). In this way, using the b bits of binary data of waveform occurrence N(T,A) as the binary address of the subROM$_L$, corresponding waveform brightness value D(T,A) at the current brightness gradation L can be obtained through look-up table in the subROM$_L$.

2 Claims, 4 Drawing Sheets

METHOD FOR QUICKLY ADJUSTING THE WAVEFORM BRIGHTNESS OF DIGITAL THREE-DIMENSIONAL OSCILLOSCOPE

This application claims priority under the Paris Convention to Chinese Patent Application No. 201010593528.6, Filed Dec. 17, 2010, the entirety of which is hereby incorporated by reference for all purposes as if fully set forth herein.

FIELD OF THE INVENTION

The present invention relates to the field of digital three-dimensional (3D) oscilloscope, more particularly to a method for quickly adjusting the waveform brightness of digital three-dimensional (3D) oscilloscope.

BACKGROUND OF THE INVENTION

In a data acquisition system, the amplitude of unknown signal is adjusted via analog channel of a digital 3D oscilloscope before being sampled, quantified and coded by an analog-to-digital converter (ADC), from which binary data of certain bits in relation to signal amplitude are outputted. Such binary data is referred to as the sampling value of input signal.

Extracting information such as amplitude, frequency, etc. of the input signal directly from a series of binary data turns out to be rather difficult. Therefore, a simpler and more direct method is needed. In general data acquisition system, sampling values are converted into more visualized image and displayed on the screen by utilizing data processing components such as FPGA, DSP, etc. with the application of certain rules. Nowadays, screens are mainly of liquid crystal display (LCD), from which users can observe information carried by the signal directly.

At present, all data acquisition systems represented by digital oscilloscope are capable of adjusting brightness of waveform displayed on LCD continuously so as to achieve display effects that can satisfy different requirement. In the data processing and displaying mechanisms of digital storage oscilloscope (DSO), only two-dimensional information, i.e. amplitude and time of input signal is provided, without information of the third dimension (relationship of amplitude change over time). So there are only two kinds of status of "color available" and "color not available" in waveform display on LCD, without the information of "color and color depth". For reasons as given above, during adjusting brightness of displayed waveform of DSO, the entire waveform turns brighter and dimmer according to a certain proportion. Under such circumstances, adjusting brightness of waveform does not make much sense.

The third generation oscilloscopes represented by digital phosphor oscilloscopes (DPO) made by Tektronix Inc. are defined as digital three-dimensional oscilloscope (DTO) in General Code for Digital Storage Oscilloscope (GB/T 15289-2009). The third generation oscilloscopes are quite different from DSO in the mechanisms of data processing and displaying.

Through multiple mapping of waveform sampling value obtained by high-speed sampling of ADC, data processing system of digital 3D oscilloscope accumulates multiple waveforms into one image that contains 3D information, i.e. amplitude, time and relationship of changes of amplitude over time, of the input signals before delivering it to LCD for display. What is displaying on LCD is an image that contains probability information of the waveform. That is to say, deeper color and lighter color will be presented at places of the image where probability of occurrence of waveform is higher and lower, respectively. Based on displaying principle of LCD, depth of waveform color will be a one-to-one correspondence to corresponding brightness of the display. Therefore, there is practical meaning to realize continuous waveform brightness adjusting in DTO. For instance, when observing some abnormal waveforms possibly exist among periodic signals with continuous recurrence, due to the fact that probability of recurrence of abnormal waveforms is much lower than that of continuous recurrence of periodic signals, it is impossible to observe abnormal waveforms of very light color under some levels of display brightness. It is therefore necessary for the users to increase brightness of displayed waveform with a certain proportion under the precondition that brightness gradation of the waveform displayed on the screen is kept unchanged, for the purpose of not only maintaining the brightness contrast of waveform probability display, but for the convenience of users in their observation and analysis of waveform of low probabilities so as to derive fault information and to take timely correction measures as well.

In order to display statistic data of waveform on LCD with a display brightness that is in line with the current brightness gradation, statistic data are generally amplified or minified in a certain proportion so as to be converted into corresponding values of three primary colors (RGB) of LCD. Assuming that the waveform occurrence is N(T,A) at the time of T and amplitude of A, and waveform brightness value corresponding to a certain type of color finally displayed on LCD is D(T,A), and proportion value corresponding to the current brightness gradation L is $p_L$, then, the relationship among them is as the follows:

$$D(T,A)=p_L \cdot N(T,A) \quad (1)$$

In processing system of digital 3D oscilloscope, calculation of formula (1) can be accomplished in a digital signal processor (DSP) or in a field programmable gate array (FPGA). Since computing speed of a DSP is far slower than that of a FPGA, calculation of formula (1) is generally chosen to be performed in a FPGA.

In formula (1), the proportion value $p_L$ corresponds to the current brightness gradation L. Brightness gradation is generally indicated with percentage (1%□100%) in data acquisition system. If brightness gradations are M in a digital 3D oscilloscope system, the brightness gradation $L(0 \le L \le M-1)$ will correspond to one of M proportion values. Decimal will occur unavoidably in proportion value $p_L$, and it is generally difficult to achieve multiplication of decimal in a FPGA. If calculation of decimal is processed with calculation mode of fractional number, then:

$$p_L = \frac{n_L}{m_L} \quad (2)$$

In formula (2), $n_L$, $m_L$ are integers and are relatively prime, thus:

$$D(T, A) = p_L \cdot N(T, A) = \frac{n_L}{m_L} \cdot N(T, A) \quad (3)$$

In calculation process of formula (3), multiplication and division of integers will occur. Because computing speed of division is much slower than that of multiplication in a FPGA, speed of the entire data processing process is thus reduced. In addition, great number of built-in multiplying units of a FPGA is required to finish multiplication calculation in formula (3) respectively since there are multiple signal channels in a digital 3D oscilloscope system, and processing process of waveform display of each channel is almost fully independent of each other. Due to limited resources of built-in multiplying units in a common FPGA, such requirement may not be able to be satisfied.

SUMMARY OF THE INVENTION

The objective of the present invention is to overcome the insufficiency of prior art, and to provide a method for quickly adjusting the waveform brightness of digital three-dimensional (3D) oscilloscope, which will not utilize built-in multiplier of FPGA.

In order to achieve the above-mentioned objective, the present invention provides a method for quickly adjusting the waveform brightness of digital three-dimensional (3D) oscilloscope, which comprises the following steps:

(1). The brightness gradations are M in digital 3D oscilloscope, let $a=\lfloor \log_2 M \rfloor+1$, in which $\lfloor \log_2 M \rfloor$ is the largest integer not exceeding $\log_2 M$;

In the accumulation process of waveform information mapping of digital three-dimensional oscilloscope, b bits of binary data are used for the waveform occurrence N(T,A) at the time of T and amplitude of A;

(2). Create a ROM in FPGA and take it as a look-up table of screen display brightness value of LCD for the waveform occurrence N(T,A) at the current brightness gradation L: address of the ROM is c=a+b bits; brightness gradation L is $0 \leq L \leq M-1$;

Divide the ROM into $2^a$ sub ROMs, each sub ROM has the capacity of $2^b \times d$ bits; Sub ROM corresponding to the current brightness gradation L is labeled as subROM$_L$;

Increase the waveform occurrence N(T,A), assign the value of round($p_L \cdot$N(T,A)) to waveform brightness value D(T,A) and store it correspondingly into the subROM$_L$ of $2^b \times d$ bits by ascending order of the b bits of binary data of waveform occurrence N(T,A); In this way, using the b bits of binary data of waveform occurrence N(T,A) as the binary address of the subROM$_L$, corresponding waveform brightness value D(T,A) at the current brightness gradation L can be obtained through look-up table in the subROM$_L$; round(·) mentioned above means that decimal in the bracket is round into integer, and $p_L$ is the proportion value of brightness gradation L;

(3). During the process of adjusting displayed waveform brightness, a bits binary number that represents the current brightness gradation L is generated by digital three-dimensional oscilloscope to serve as the higher a bits of the c bits address of the ROM to address the corresponding sub ROM subROM$_L$; Take statistics of b bits of binary data of waveform occurrence N(T,A) as the lower b bits of the c bits address of the ROM for addressing the corresponding waveform brightness value D(T,A) under the current brightness gradation L in the sub ROM subROM$_L$; and then display it.

the objective of the present invention is realized as the follows:

In a digital three-dimensional oscilloscope, statistics of multiple accumulation of waveform mapping provides waveform occurrence at specific time and amplitude during a certain time interval. How to convert, in a simple and speedy way, such waveform occurrence to a waveform brightness that tallies with the current user-set brightness gradation is the problem needs to be solved in the present invention. In the prior art, if multipliers in a FPGA are used to realize the conversion of waveform occurrence to waveform brightness that is in line with the present user-set brightness gradation, speed of conversion is slow and procedure for the realization of the objective is rather complicated. Besides, resource of built-in multipliers of FPGA is so limited that the conversion requirement can not be met at times.

The present invention, a method for quickly adjusting the waveform brightness of digital three-dimensional (3D) oscilloscope, creates a ROM in FPGA and take it as a look-up table of screen display brightness value of LCD that is corresponding to the waveform occurrence N(T,A) at the current brightness gradation L, and divide the ROM into $2^a$ sub ROMs, each sub ROM has the capacity of $2^b \times d$ bits. Sub ROM corresponding to the current brightness gradation L is labeled as subROM$_L$; Increase the waveform occurrence N(T,A), assign the value of round($p_L \cdot$N(T,A)) to waveform brightness value D(T,A) and store it correspondingly into the subROM$_L$ of $2^b \times d$ bits by ascending order of the b bits of binary data of waveform occurrence N(T,A). In this way, using the b bits of binary data of waveform occurrence N(T,A) as the binary address of the subROM$_L$, corresponding waveform brightness value D(T,A) at the current brightness gradation L can be obtained through look-up table in the subROM$_L$. Therefore, utilization of multiplier in the FPGA is no longer required. In addition, brightness gradation L and waveform occurrence N(T,A) at the time T and aptitude A are taken as higher a bit ROM address and the lower b bit ROM address for addressing in the created ROM, corresponding waveform brightness value D(T,A) can be found. Therefore, compared with complex computation of multiplication, adjusting waveform brightness is simpler and faster.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
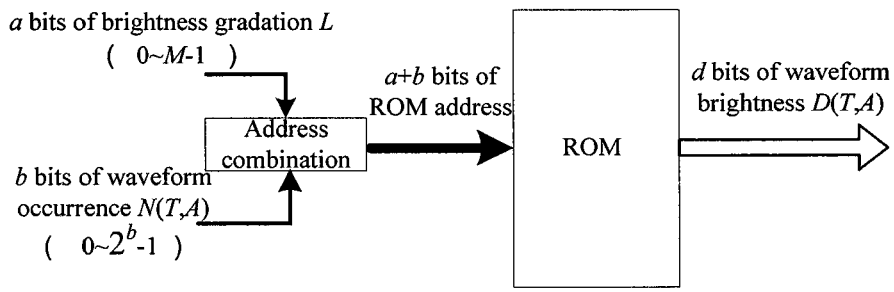
FIG. 1 is a schematic diagram of the method for quickly adjusting the waveform brightness of digital three-dimensional oscilloscope according to one embodiment of the present invention.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

FIG. 1 is a schematic diagram of the method for quickly adjusting the waveform brightness of digital three-dimensional oscilloscope according to one embodiment of the present invention.

Brightness of a digital three-dimensional (3D) oscilloscope has M gradations. Let $a=\lfloor \log_2 M \rfloor +1$, in which $\lfloor \log_2 M \rfloor$ is the largest integer not exceeding $\lfloor \log_2 M \rfloor$. In the accumulation process of information mapping of digital 3D oscilloscope, b bit of binary data are used for the waveform occurrence N(T,A) at the time of T and amplitude of A; That is to say, the maximum value of waveform occurrence N(T,A) is $2^b-1$, in which the value of b is set according to specific embodiment. It is known from formula (3) that at a certain value of $p_L$, the values of $n_L$, $m_L$ are solely determined by $p_L$. Value of waveform occurrence N(T,A) is in the range of $0 \sim 2^b-1$, in which there is a total of $2^b$ number of data, and the corresponding brightness values D(T,A) of waveform finally displayed also have $2^b$ number of results in an one-to-one correspondence manner. In addition, under the circumstance of fixing waveform occurrence N(T,A), continuous adjust brightness gradation L of the oscilloscope, then the proportion value $p_L$, changes in M proportion values, therefore the products of waveform occurrence N(T,A) and brightness gradation L have M waveform brightness values D(T,A) corresponding to different brightness gradation L, and represent M display brightness levels corresponding to the same waveform occurrence N(T,A) on the LCD display screen of the oscilloscope.

Create a ROM in a FPGA, to be served as a look-up table of LCD screen display brightness value for waveform occurrence N(T,A) under different brightness gradation L: address of the ROM is c=a+b bit, and one storage unit can store d bit of binary value of waveform brightness D(T,A) in which d is determined by LCD and resource required is $2^b \times d$ bits, as shown in FIG. 1.

It can be seen from FIG. 1, a digital three-dimensional oscilloscope sends out a bits binary data of L that represents brightness gradation, to be served as the higher a bits of the c bits address of the ROM, and it take statistics of b bits of binary data of waveform occurrence N(T,A) as lower address of the ROM.

Description of data storage structure in the ROM is given hereunder.

Figure 2:
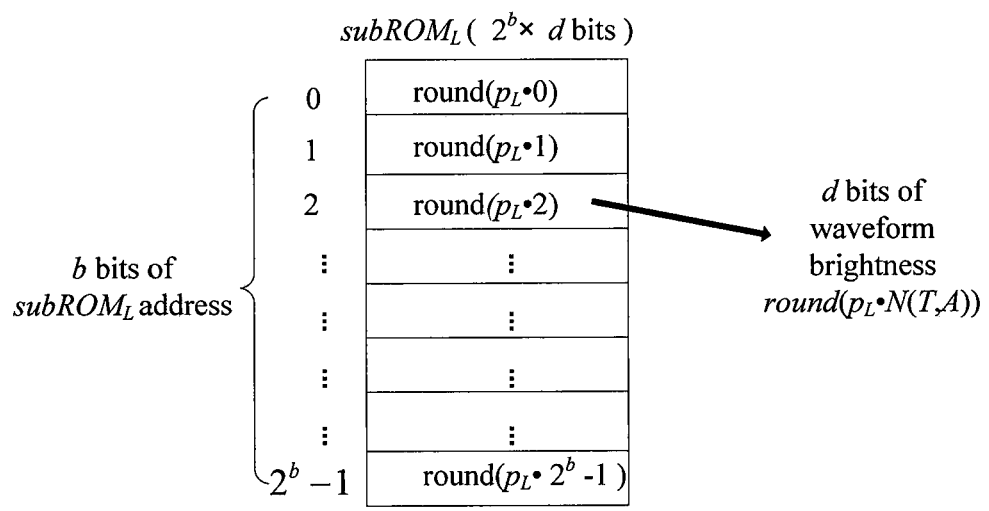
FIG. 2 is a schematic diagram of the sub ROM according to one embodiment of the present invention.
Figure 3:
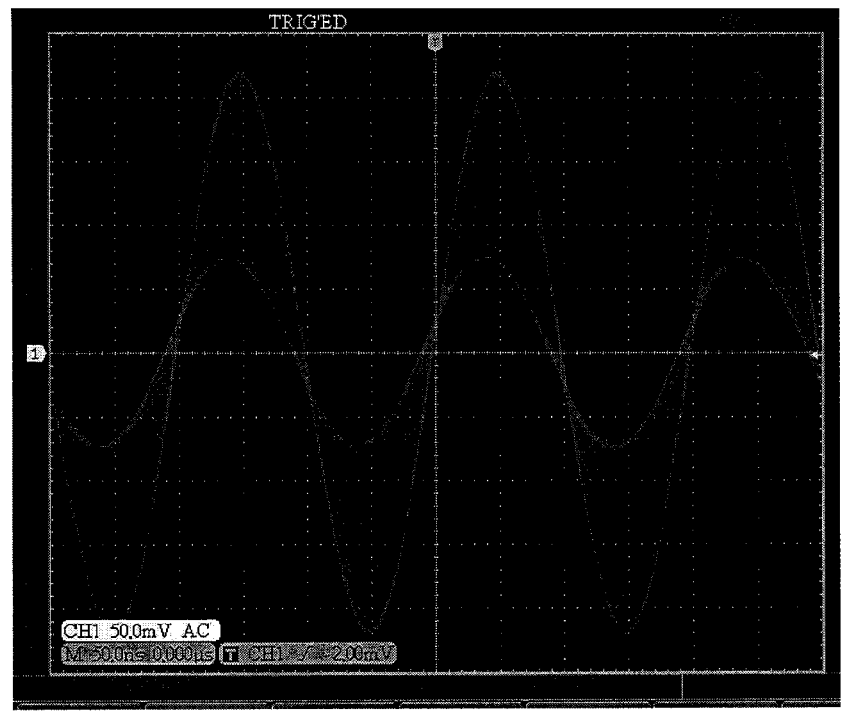
FIG. 3 is a waveform at the brightness gradation 10% according to one embodiment of the present invention.
Figure 4:
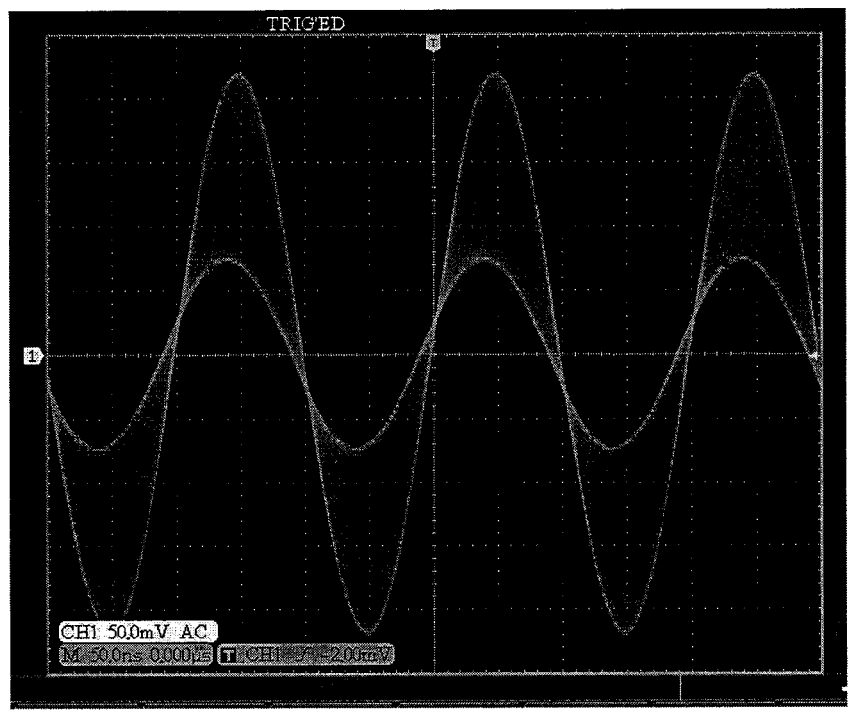
FIG. 4 is a waveform at the brightness gradation 20% according to one embodiment of the present invention.
Figure 5:
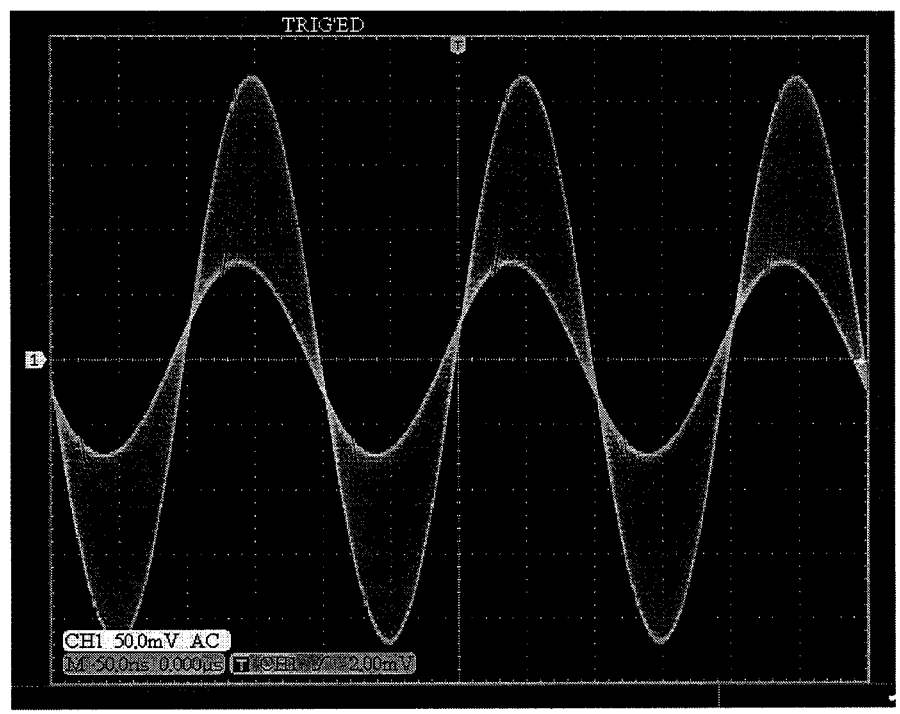
FIG. 5 is a waveform at the brightness gradation 30% according to one embodiment of the present invention.
Figure 6:
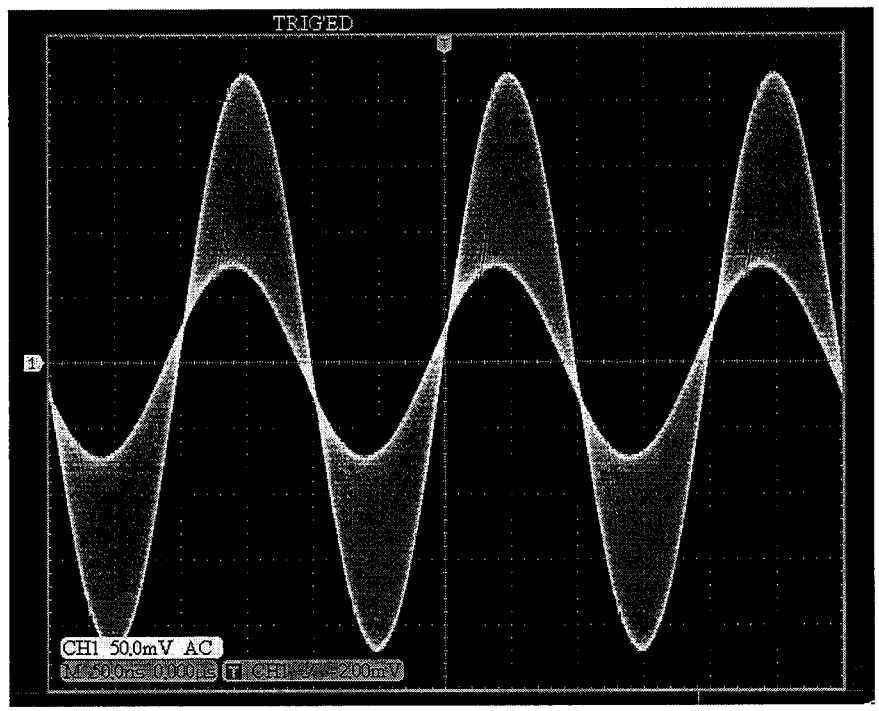
FIG. 6 is a waveform at the brightness gradation 50% according to one embodiment of the present invention.
Figure 7:
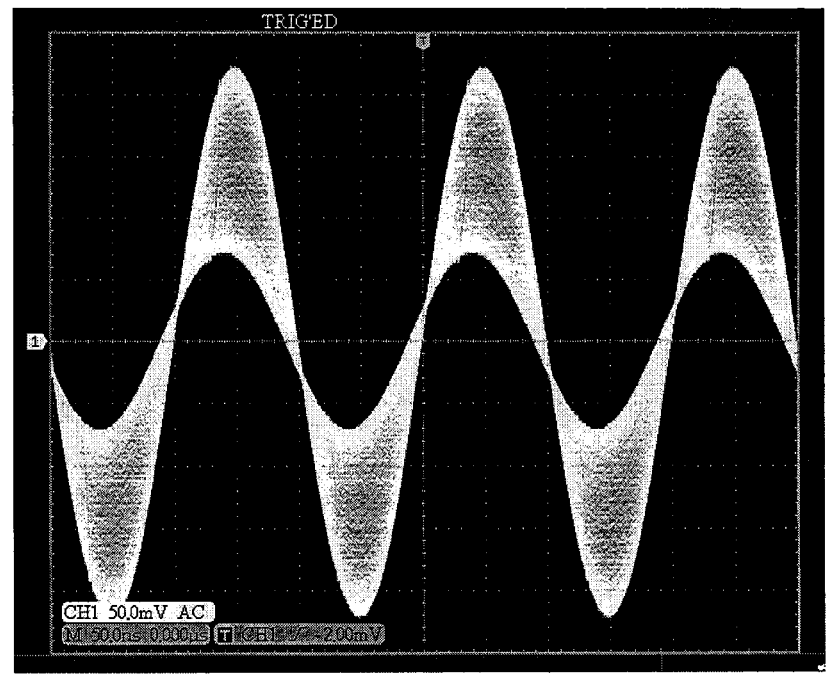
FIG. 7 is a waveform at the brightness gradation 70% according to one embodiment of the present invention.
Figure 8:
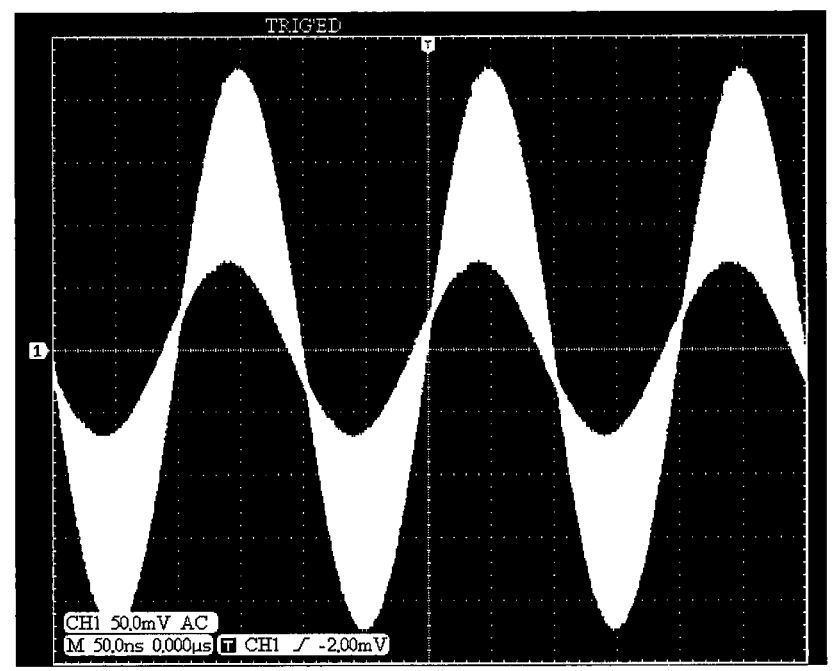
FIG. 8 is a waveform at the brightness gradation 100% according to one embodiment of the present invention.

FIG. 2 is a schematic diagram of the sub ROM according to one embodiment of the present invention.

First of all, the ROM can be divided into $2^a$ sub ROMs, each sub ROM has the capacity of $2^b \times d$ bits, Sub ROM corresponding to the current brightness gradation L is labeled as subROM$_L$. In the embodiment, only the first M Sub ROMs are valid, i.e. subROM$_0$~subROM$_{M-1}$, as shown in FIG. 1. The higher a bits of the c bits address of the ROM is utilized to address the corresponding sub ROM subROM$_L$. When brightness gradation L is adjusted by the user, the oscilloscope will send out a bits binary number that represents the current brightness gradation L is generated by digital three-dimensional oscilloscope to serve as the higher a bits of the c bits address of the ROM to address the corresponding sub ROM subROM$_L$.

In formula (3), If brightness gradation L is different, the proportion value $p_L$, is also different. Consequently, waveform brightness value D(T,A) that is corresponding to the same value of waveform occurrence N(T,A) is also different. In case of fixed brightness gradation, the proportion value $p_L$ in the formula (3) is fixed, which is corresponding to a total of $2^b$ number of data of waveform occurrence N(T,A) within the input range of $0\sim 2^b$. After rounding $2^b$ number of products, i.e. round($p_L \cdot$N(T,A)), they will be stored correspondingly into the subROM$_L$ of $2^b \times d$ bits by ascending order of the b bits of binary data of waveform occurrence N(T,A). In this way, In this way, using the b bits of binary data of waveform occurrence N(T,A) as the binary address of the subROM$_L$, corresponding waveform brightness value D(T,A) at the current brightness gradation L can be obtained through look-up table in the subROM$_L$; round(·) mentioned above means that decimal in the bracket is round into integer. Actual structure of the ROM is shown in FIG. 2.

In a digital three-dimensional oscilloscope, for M proportion values corresponding to M brightness gradations, there have M sub ROMs of the same size but of different contents as shown in FIG. 2, i.e. subROM$_0$~subROM$_{M-1}$. M of such kind of subROM$_L$ constitute the above-mentioned ROM of the size of $2^{a+b} \times d$ bits. Addressing of waveform brightness storage unit correlated with proportion value $p_L$ and waveform occurrence N(T,A) in formula (3) can be directly achieved via a+b bits address, and the d bit of waveform brightness value D(T,A) is obtained.

Example

In this example, the present invention, a method for quickly adjusting the waveform brightness of digital three-dimensional oscilloscope is applied in a two-channel digital three-dimensional oscilloscope. In such a digital three-dimensional oscilloscope, brightness gradations M=100 is adopted, thus, $a=[\log_2 100]+1=7$. Waveform occurrence N(T,A) is done with b=6 bits binary number, therefore, maximum value is 63 and those exceeding 63 is taken as 63. The waveform brightness value is recorded with d=8 bits binary number and two identical ROM tables are utilized respectively for look-up table of the two channels. Total FPGA storage unit resource required is $2 \times 2^{a+b} \times d$ bits$=2 \times 2^{7+6} \times 8$ bit$=16$ KB. The entire ROM addressing process does not require multiplier at all, and faster computing speed can be achieved in this way as compared with that of a multiplier.

FIG. 3 to FIG. 8 are waveforms at the brightness gradation 10%, 20%, 30%, 50%, 70%, 100% according to one embodiment of the present invention.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A method for adjusting waveform brightness for a waveform formatted for display on a digital three-dimensional oscilloscope DTO$_M$ having brightness gradations M such that the waveform can be displayed on a digital three-dimensional oscilloscope DTO$_L$ having brightness gradations L, where $a=\lfloor \log_2 M \rfloor +1$, in which $\lfloor \log_2 M \rfloor$ is the largest integer not exceeding $\log_2 M$, and wherein b bits of binary data correspond to waveform occurrences N(T,A) at the time of T and amplitude of A for DTO$_M$, wherein brightness gradation L is $0 \leq L \leq M-1$ and $p_L$ is the proportion value of brightness gradation L, the method comprising:

creating a read-only memory (ROM) in a field programmable gate array (FPGA) and storing in the ROM a look-up table correlating screen display brightness values of DTO$_M$ for the waveform occurrence N(T,A) to screen display brightness values of DTO$_L$ for waveform occurrences D(T,A), wherein a corresponding address of the ROM for each the waveform occurrences N(T,A) is c=a+b bits such that a bits is a binary number that represents the current brightness gradation L and serve as the higher a bits of the c bits address and b bits of binary data of waveform occurrence N(T,A) serve as the lower b bits of the c bits;

dividing the ROM into $2^a$ sub ROMs, wherein each sub ROM has a predetermined the capacity of $2^b \times d$ bits; and wherein one of the sub ROMs corresponding to the current brightness gradation L is labeled as subROM$_L$;

assigning integer values of round($p_L \cdot$N(T,A)) to waveform brightness values D(T,A) and storing the assigned integer values correspondingly into the subROM$_L$ of $2^b \times d$ bits by ascending order of the b bits of binary data of waveform occurrence N(T,A);

obtaining corresponding waveform brightness value D(T, A) at the current brightness gradation L through look-up table in the subROM$_L$ using the b bits of binary data of the c bits address of waveform occurrence N(T,A) as the binary address of the subROM$_L$, and displaying the waveform on DTO$_L$, according to the corresponding waveform brightness value D(T,A).

2. A method for adjusting waveform brightness of claim 1, wherein if one of the waveform occurrences N(T,A) at the time of T and amplitude of A exceeds $2^b-1$, $2^b-1$ will be assigned as the b bits of binary data of the c bits address for the one of the waveform occurrences N(T,A).

* * * * *